(12) United States Patent
Mohanty

(10) Patent No.: US 9,000,848 B2
(45) Date of Patent: Apr. 7, 2015

(54) NOISE REDUCTION IN MEMS OSCILLATORS AND RELATED APPARATUS AND METHODS

(71) Applicant: Sand 9, Inc., Cambridge, MA (US)

(72) Inventor: Pritiraj Mohanty, Los Angeles, CA (US)

(73) Assignee: Sand 9, Inc., Cambridge, MA (US)

( * ) Notice: Subject to any disclaimer, the term of this patent is extended or adjusted under 35 U.S.C. 154(b) by 37 days.

(21) Appl. No.: 13/941,906

(22) Filed: Jul. 15, 2013

(65) Prior Publication Data

US 2014/0015616 A1 Jan. 16, 2014

Related U.S. Application Data

(60) Provisional application No. 61/671,962, filed on Jul. 16, 2012.

(51) Int. Cl.
H03B 21/02 (2006.01)
H03B 25/00 (2006.01)
H03B 5/30 (2006.01)
H03B 21/01 (2006.01)

(52) U.S. Cl.
CPC .................. *H03B 21/02* (2013.01); *H03B 5/30* (2013.01); *H03B 21/01* (2013.01); *H03B 25/00* (2013.01)

(58) Field of Classification Search
CPC ........ H03B 25/00; H03B 21/00; H03B 21/01; H03B 21/02; H03B 5/30
USPC .................. 331/19, 37, 38, 39, 41, 74, 116 M, 331/116 R, 116 FE, 158, 154, 155, 107 A
See application file for complete search history.

(56) References Cited

U.S. PATENT DOCUMENTS

| | | | |
|---|---|---|---|
| 7,446,620 B2 * | 11/2008 | Partridge et al. | 331/156 |
| 7,965,044 B2 * | 6/2011 | Takada et al. | 315/39 |
| 8,058,769 B2 | 11/2011 | Chen et al. | |
| 8,319,566 B2 | 11/2012 | Rebel et al. | |
| 2006/0105729 A1 * | 5/2006 | Gris | 455/260 |

* cited by examiner

*Primary Examiner* — Ryan Johnson
(74) *Attorney, Agent, or Firm* — Wolf, Greenfield & Sacks, P.C.

(57) ABSTRACT

Mechanical resonating structures are used to generate signals having a target frequency with low noise. The mechanical resonating structures may generate output signals containing multiple frequencies which may be suitably combined with one or more additional signals to generate the target frequency with low noise. The mechanical resonating structures may be used to form oscillators.

13 Claims, 2 Drawing Sheets ic resonator output signal exhibiting multiple frequencies establishing a frequency comb may be suitably processed to generate therefrom a second frequency comb. Suitable combination of the first and second frequency combs may produce a signal of a target frequency having less noise than that of the initial output signal of the mechanical resonator.

NOISE REDUCTION IN MEMS OSCILLATORS AND RELATED APPARATUS AND METHODS

CROSS-REFERENCE TO RELATED APPLICATIONS

This Application claims the benefit under 35 U.S.C. §119 (e) of U.S. Provisional Application Ser. No. 61/671,962, entitled "NOISE REDUCTION IN MEMS OSCILLATORS AND RELATED APPARATUS AND METHODS" filed on Jul. 16, 2012, which is hereby incorporated herein by reference in its entirety.

BACKGROUND

1. Field

The present application relates to noise reduction in oscillators, such as MEMS oscillators, and related apparatus and methods.

2. Related Art

Mechanical resonating structures, such as micro-electromechanical systems (MEMS) resonators, generate oscillating signals when excited by an appropriate drive signal. The oscillating signals are typically characterized by one or more target frequencies in addition to other frequencies constituting noise.

SUMMARY

According to an aspect of the present application, a method is provided, comprising generating a multiple-frequency output signal of a mechanical resonating structure, generating, from the multiple-frequency output signal, a correction signal comprising at least one frequency, and combining the correction signal and at least a portion of the multiple-frequency output signal.

According to an aspect of the present application, a timing oscillator is provided, comprising a mechanical resonator and a driving circuit configured to excite the mechanical resonator. The mechanical resonator is configured to produce a multiple-frequency output signal in response to being excited by the driving circuit. The timing oscillator further comprises correction circuitry configured to generate, from the multiple-frequency output signal, a correction signal comprising at least one frequency. The timing oscillator further comprises combination circuitry configured to combine the correction signal and at least a portion of the multiple-frequency output signal.

BRIEF DESCRIPTION OF THE DRAWINGS

Various aspects and embodiments of the technology will be described with reference to the following figures. It should be appreciated that the figures are not necessarily drawn to scale. Items appearing in multiple figures are indicated by the same or similar reference number in all the figures in which they appear.

DETAILED DESCRIPTION

The inventors have appreciated that the electrical noise of signals produced by a mechanical resonator may be reduced or eliminated using frequency comb techniques. A mechanical resonator output signal exhibiting multiple frequencies establishing a frequency comb may be suitably processed to generate therefrom a second frequency comb. Suitable combination of the first and second frequency combs may produce a signal of a target frequency having less noise than that of the initial output signal of the mechanical resonator.

According to an aspect, a timing oscillator including a mechanical resonator and configured to produce an output signal of a target frequency (e.g., a frequency matching or consistent with design specifications) having low noise is described. The timing oscillator may include drive circuitry configured to excite the mechanical resonator. Suitable excitation may result in the mechanical resonator producing an output signal having multiple frequencies. The output signal may be processed by suitable circuitry to generate a correction signal. Combination circuitry may suitably combine the output signal of the mechanical resonator and the correction signal to produce the output signal of the timing oscillator having the target frequency.

The aspects described above, as well as additional aspects, are described further below. These aspects may be used individually, all together, or in any combination of two or more, as the technology is not limited in this respect.

Frequency comb spectroscopy is an optical technique using ultrafast lasers for high precision measurement of frequencies for metrology applications. Such operation is described in connection with FIGS. 1A, 1B and 2.

Figure 1A:
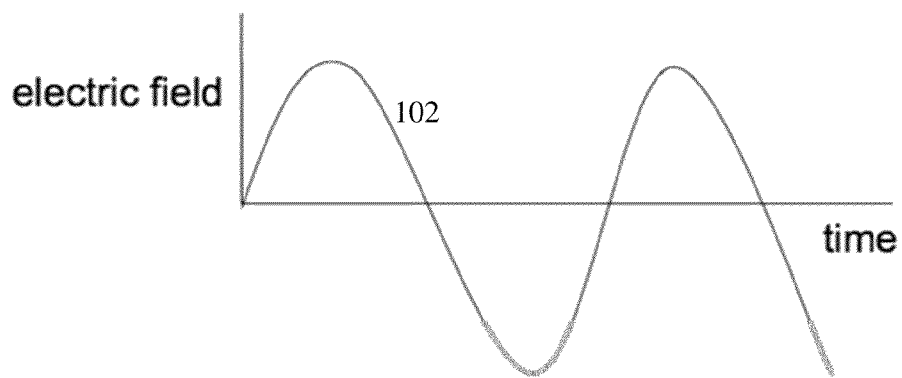
FIG. 1A illustrates the amplitude of the electric field of a continuous wave monochromatic laser as a function of time.
Figure 1B:
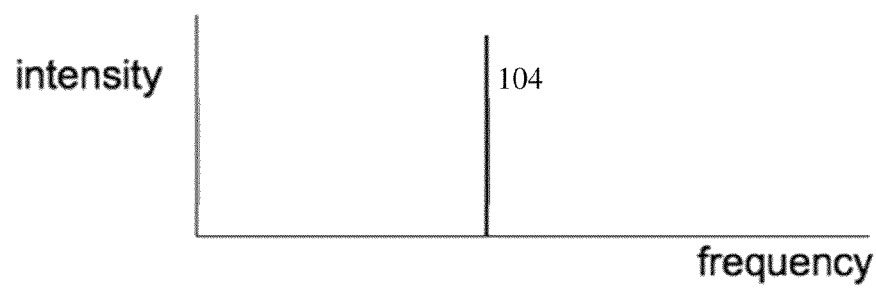
FIG. 1B illustrates the electric field of the continuous wave monochromatic laser of FIG. 1A in the frequency domain, with the y-axis representing intensity and the x-axis representing frequency.

A monochromatic continuous wave (CW) laser has a single wavelength, as shown in FIG. 1A, which illustrates the magnitude of the electric field of a wave 102 as a function of time. In the frequency domain, a monochromatic CW laser is represented by a single frequency. If the monochromatic CW laser is ideal, it is represented in the frequency domain by a delta function 104, as shown in FIG. 1B, in which the y-axis represent intensity and the x-axis represents frequency.

Figure 2:
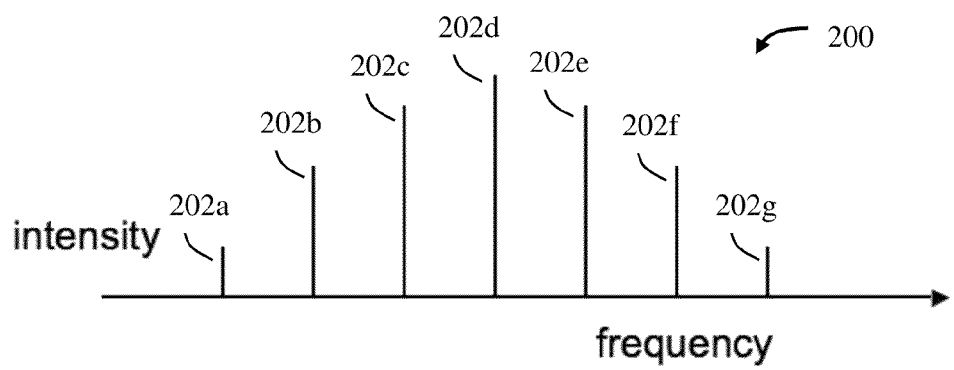
FIG. 2 illustrates a frequency comb, with the y-axis representing intensity and the x-axis representing frequency.

A frequency comb contains a number of single-frequency fields spanning over a frequency range, with each individual frequency field representing a tooth in the comb, as shown in FIG. 2, which illustrates a frequency comb 200 containing seven discrete frequencies 202a-202g.

Optical frequency combs (i.e., frequency combs generated with an optical source, such as a laser) are used to measure frequencies because of their ability to measure high frequencies with high accuracy. The physical distance between the teeth of the optical frequency comb can be determined and corresponds to the difference in frequency between the teeth. When the frequency of a target signal of unknown frequency is to be measured, the target signal may be represented in the frequency domain and superimposed on the optical frequency comb. The relative position of the target signal in the frequency domain compared to the teeth of the optical frequency comb is used to determine the frequency of the target signal. For instance, if the target signal is located midway between two teeth of the frequency comb in the frequency domain, then the frequency of the target signal is in the middle of the respective frequencies of the teeth between which the target signal lies.

The individual frequencies of an optical frequency comb may be in the terahertz (THz) range, thus allowing for frequency measurements in that range, which conventional frequency measurement circuitry may not be capable of measuring. The difference between frequencies of an optical frequency comb (i.e., the frequency difference between distinct teeth of the optical frequency comb) may be in the gigahertz (GHz) range. Thus, frequency measurements of target signals having high frequencies (in the terahertz range) can be made with high accuracy (in the gigahertz range).

The inventors have appreciated that, in the context of mechanical resonators and the signals produced therefrom, frequency combs may be used for a different purpose than to measure signal frequencies. That is, frequency combs may be used in the context of mechanical resonators to generate electrical signals of a target frequency with low noise.

Accordingly, non-limiting aspects of the present application provide methods and apparatus utilizing frequency comb techniques to generate electrical signals having a target frequency with reduced or eliminated noise. The apparatus may include a mechanical resonator (e.g., a micro-electro-mechanical systems (MEMS) resonator) and suitable circuitry for driving the mechanical resonator as well as processing signals output by the mechanical resonator.

According to an aspect of the present application, a MEMS-resonator based timing oscillator is provided that generates a frequency comb of multiple frequency signals. The relationship between these frequencies (or teeth) may be used to generate a single final frequency, which is superior in terms of stability and noise characteristics compared to a conventional MEMS-resonator based timing oscillator.

Comb Generation

As mentioned, various aspects of the present application involve generation of a frequency comb from a mechanical resonator. Non-limiting examples of manners in which such a frequency comb may be generated are now described.

A micro-electro-mechanical systems (MEMS) resonator is a passive component (in that the resonator's oscillation is excited by a driving force from an external source) which may be operated in a single mode of resonance, corresponding to a single frequency. By the use of an electronic circuit on a board or integrated circuit, self-sustained oscillation can be created with the MEMS resonator, and thus a timing oscillator may be formed. Typically, the electronic circuit coupled to the MEMS resonator is configured to reduce additional signals around the central frequency of interest that may be generated by unwanted resonances in the resonator or in the circuit elements. These so-called spurious signals are conventionally considered detrimental to the operation of the timing oscillator as a single frequency source.

However, MEMS resonators usually have many resonance modes. In non-ideal timing oscillator systems, the driving circuit can excite more than one mode. Multiple modes can also be excited because of non-ideal designs of the resonator, where the resonance mode of interest can be intrinsically coupled to other modes. One typical example of this is the coupling between the suspended part of the MEMS resonator and the anchors, which results in spurious modes. In the frequency domain, these spurious modes appear as sidebands of the main resonant mode, as given by Equation 1:

$$f_n = f_0 + [\text{sgn}(f_s - f_0)]f_s \quad [\text{Eq. 1}]$$

Here, the sign function sgn(x) determines whether the spurious mode is to the left or to the right of the central frequency $f_0$. The index s spans over the number of spurious mode frequencies, and n represents an integer.

Thus, a frequency comb may be generated as an output signal of a mechanical resonator by exciting multiple modes of the mechanical resonator.

Another manner in which a multiple frequency output (e.g., a frequency comb) of a MEMS-based timing oscillator may be generated is via nonlinear driving. If the driving circuit is used to drive the MEMS resonator nonlinearly at a specific resonance mode, then the oscillator output may display harmonics of the primary oscillation. The output signal contains a series of frequencies, which, in the frequency domain, resemble a comb. This may be an ideal comb as the separation between the teeth of the comb may be constant, as given by Equation 2:

$$f_n = n f_0 \quad [\text{Eq. 2}]$$

where n is an integer and $f_0$ is the central frequency.

Noise Cancellation Using a Frequency Comb

Once a frequency comb is established, then the frequency comb may be used for noise cancellation. Noise cancellation may be achieved by performing mathematical operations to obtain an output at the target frequency by subtraction or cancellation of the noise components.

Consider an ideal frequency comb, represented in the frequency domain by Equation 3:

$$f_n = f_0 + n f_r, \quad [\text{Eq. 3}]$$

where n is an integer and $f_r$ is the comb tooth spacing. If the comb spans an octave in frequency (a factor of 2), then it is known as an octave-spanning comb. As an example, Equation 4 shows how background noise can be cancelled, and a signal with improved noise characteristics compared to that of the initially produced comb may be produced.

$$2f_n - f_{2n} = (2f_0 + 2nf_r) - (f_0 + 2nf_r) = f_0 \quad [\text{Eq. 4}]$$

Figure 3:
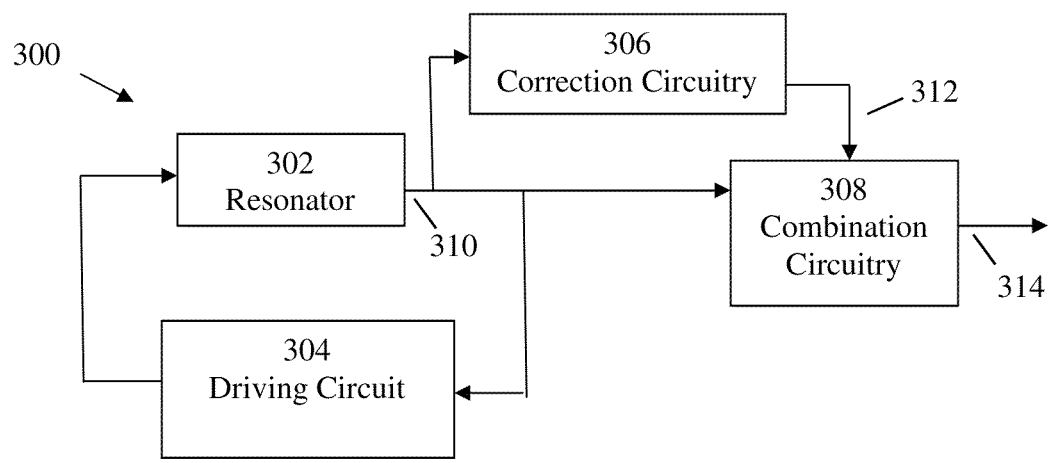
FIG. 3 illustrates a timing oscillator, according to a non-limiting embodiment.

Any suitable circuitry may be used to perform the functionality of Equation 4. For example, a timing oscillator including a mechanical resonator may further include processing circuitry (e.g., correction and/or combination circuitry) for performing the operations illustrated in Equation 4. A non-limiting example of such processing circuitry is shown in FIG. 3.

As shown, the timing oscillator 300 comprises a resonator 302 (e.g., a MEMS resonator or any other suitable resonator), a driving circuit 304 coupled to the resonator 302 in a feedback loop and configured to excite the resonator 302, correction circuitry 306, and combination circuitry 308. The correction circuitry 306 may receive the output signal 310 of the resonator 302 and generate a correction signal 312 by any suitable processing. The combination circuitry 308 is configured to receive both the output signal 310 of the resonator 302 and the correction signal 312 from the correction circuitry 306 and generate an output signal 314 of the timing oscillator 300.

According to a non-limiting embodiment, the output signal 310 of the resonator 302 is a first frequency comb, the correction circuitry 306 generates a second frequency comb as the correction signal 312, and the combination circuitry 308 combines the first and second frequency combs suitably to produce an output signal 314 having a single frequency with lower noise (and higher stability in some cases) than either the first or second frequency combs. Alternatives are possible, however.

According to an aspect of the present application, frequency comb techniques may be applied in the context of mechanical resonators for functions other than (or in addition to) noise reduction. For example, frequency comb techniques may be applied for signal down conversion or up conversion, timing synchronization in a network, frequency multiplication and parametric amplification.

One or more aspects of the present application may provide various benefits. Some non-limiting examples are now described. However, it should be appreciated that not all aspects necessarily provide all listed benefits, and that additional benefits other than those listed may be provided. One or more aspects may provide timing oscillators producing a target output reference frequency with superior phase noise characteristics compared to conventional timing oscillators. Jitter may also (or alternatively) be reduced or eliminated. In addition, the reference frequency can also provide a higher degree of stability.

Mechanical resonating structures as described herein may be varied in multiple ways. These include choice of material—silicon is still the material of choice for most integrated circuits, but other materials might be more commercially expedient. Piezoelectric materials such as Aluminum Nitride (AlN) have shown much promise because of its intrinsically high stiffness (yielding high frequencies), low-temperature deposition methods, and ease of actuation/detection. Other materials include (but are not limited to) metals, other piezoelectric materials (quartz, ZnO), CVD diamond, semiconductors (GaAs, SiGe, Si), superconducting materials, and heterostructures of all kinds (piezoelectric/semiconductor, semiconductor/metal, bimetal, etc.). The resonator can be operated in a variety of ways, including piezoelectric, magnetomotive, magnetostatic, electrostatic capacitive transduction, optical, thermoelastic, thermomechanical, and piezoresistive. These methods can be used both in actuation and detection. A hybrid combination of these methods is also a possibility.

Mechanical resonating structures as described herein may be implemented in various devices. For example, timing oscillators, temperature compensated MEMS oscillators, oven-controlled MEMS oscillators, cellular phones, personal digital assistants (PDAs), personal computers, RFID tracking devices, GPS receivers, wireless-enabled appliances and peripherals (printers, digital cameras, household appliances), satellite radio receivers (Sirius/XM), military platforms, metrology devices, automobiles, land vehicles, airplanes, drones, blimps, zeppelins, ships and boats, kayaks, range finders, personal navigation devices (PNDs), laptops, tablet computers, femtocells, implantable location trackers and any location aware device are all examples of devices which may utilize one or more aspects of the present application. The mechanical resonating structures in such devices may operate in various capacities, for example as passive or active components, as filters, duplexers, switches and timing oscillators. Inertial navigation systems also use MEMS resonators in gyroscopes, accelerometers, magnetometers and altimeters, all of which contain a resonating structure. Apart from wireless and navigation-based applications, MEMS-based resonators are also used in optical switches, routers and display systems.

The mechanical resonating structures described herein may be used as stand-alone components, or may be incorporated into various types of larger devices. Thus, the various structures and methods described herein are not limited to being used in any particular environment or device. However, examples of devices which may incorporate one or more of the structures and/or methods described herein include, but are not limited to, tunable meters, mass sensors, gyroscopes, accelerometers, switches, and electromagnetic fuel sensors. According to some embodiments, the mechanical resonating structures described are integrated in a timing oscillator. Timing oscillators are used in devices including digital clocks, radios, computers, oscilloscopes, signal generators, and cell phones, for example to provide precise clock signals to facilitate synchronization of other processes, such as receiving, processing, and/or transmitting signals. In some embodiments, one or more of the devices described herein may form part or all of a MEMS.

While various aspects have been described as implementing frequency combs, it should be appreciated that not all aspects are limited in this respect. For example, aspects of the present application may apply to any multiple-frequency output signal of a mechanical resonator, whether that multiple-frequency output signal constitutes a frequency comb or not. Similarly, correction signals of the types described herein may include one or more frequencies, as a frequency comb is a non-limiting example of a suitable correction signal. Further alternatives are possible.

It should be understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment, but not necessarily in all embodiments. Consequently, appearances of the phrases "in one embodiment," "in an embodiment," or "in some embodiments" in various places throughout the Specification are not necessarily referring to the same embodiment.

Unless the context clearly requires otherwise, throughout the disclosure, the words "comprise," "comprising," and the like are to be construed in an inclusive sense as opposed to an exclusive or exhaustive sense; that is to say, in a sense of "including, but not limited to." Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list; all of the items in the list; and any combination of the items in the list.

Having thus described several aspects of at least one embodiment of the technology, it is to be appreciated that various alterations, modifications, and improvements will readily occur to those skilled in the art. Such alterations, modifications, and improvements are intended to be within the spirit and scope of the technology. Accordingly, the foregoing description and drawings provide non-limiting examples only.

What is claimed is:

1. A method, comprising:
    generating a multiple-frequency output signal of a mechanical resonating structure;
    generating, from the multiple-frequency output signal, a correction signal comprising at least one frequency; and
    combining the correction signal and at least a portion of the multiple-frequency output signal, wherein combining the correction signal and at least the portion of the multiple-frequency output signal produces a combined signal comprising a target frequency, and wherein the combined signal comprising the target frequency has greater stability than the multiple-frequency output signal.

2. The method of claim 1, wherein generating the multiple-frequency output signal comprises generating a first frequency comb, and wherein generating the correction signal comprises generating a second frequency comb.

3. The method of claim 2, wherein the mechanical resonating structure is configured to exhibit multiple resonance modes, and wherein generating the first frequency comb comprises exciting the multiple resonance modes of the mechanical resonating structure.

4. The method of claim 2, wherein generating the first frequency comb comprises non-linearly exciting the mechanical resonating structure.

5. The method of claim 1, wherein combining the correction signal and at least a portion of the multiple-frequency output signal comprises performing a subtraction operation.

6. The method of claim 1, wherein generating the correction signal comprises processing first and second frequencies of the multiple-frequency output signal.

7. A method, comprising:
  generating a multiple-frequency output signal of a mechanical resonating structure;
  generating, from the multiple-frequency output signal, a correction signal comprising at least one frequency; and
  combining the correction signal and at least a portion of the multiple-frequency output signal, wherein combining the correction signal and at least the portion of the multiple-frequency output signal produces a combined signal comprising a target frequency, and wherein the combined signal comprising the target frequency has improved noise characteristics compared to the multiple-frequency output signal.

8. A timing oscillator, comprising:
  a mechanical resonator;
  a driving circuit configured to excite the mechanical resonator, wherein the mechanical resonator is configured to produce a multiple-frequency output signal in response to being excited by the driving circuit;
  correction circuitry configured to generate, from the multiple-frequency output signal, a correction signal comprising at least one frequency; and
  combination circuitry configured to combine the correction signal and at least a portion of the multiple-frequency output signal,
  wherein the multiple-frequency output signal comprises a first frequency comb, and wherein the correction signal comprises a second frequency comb,
  wherein the mechanical resonator is configured to exhibit multiple resonance modes, and wherein the driving circuit is configured to excite the multiple resonance modes of the mechanical resonator,
  wherein the multiple resonance modes include a target resonance mode and at least one spurious resonance mode, and wherein the at least one spurious resonance mode is associated with a coupling between a suspended portion of the mechanical resonator and at least one anchor.

9. The timing oscillator of claim 8, wherein the driving circuit is configured to non-linearly excite the mechanical resonator.

10. The timing oscillator of claim 8, wherein the correction circuitry is configured to generate the correction signal by processing at least two separate frequencies of the multiple-frequency output signal.

11. A timing oscillator, comprising:
  a mechanical resonator;
  a driving circuit configured to excite the mechanical resonator, wherein the mechanical resonator is configured to produce a multiple-frequency output signal in response to being excited by the driving circuit;
  correction circuitry configured to generate, from the multiple-frequency output signal, a correction signal comprising at least one frequency; and
  combination circuitry configured to combine the correction signal and at least a portion of the multiple-frequency output signal,
  wherein the combination circuitry comprises circuitry configured to perform a subtraction operation to produce a combined signal, and
  wherein the combined signal comprises a target frequency, and wherein the combined signal comprising the target frequency has greater stability than the multiple-frequency output signal.

12. The timing oscillator of claim 11, wherein the mechanical resonator comprises silicon and a piezoelectric material.

13. A timing oscillator, comprising:
  a mechanical resonator;
  a driving circuit configured to excite the mechanical resonator, wherein the mechanical resonator is configured to produce a multiple-frequency output signal in response to being excited by the driving circuit;
  correction circuitry configured to generate, from the multiple-frequency output signal, a correction signal comprising at least one frequency; and
  combination circuitry configured to combine the correction signal and at least a portion of the multiple-frequency output signal,
  wherein the combination circuitry comprises circuitry configured to perform a subtraction operation to produce a combined signal, and
  wherein the combined signal comprises a target frequency, and wherein the combined signal comprising the target frequency has improved noise characteristics compared to the multiple-frequency output signal.

* * * * *